United States Patent
Lee et al.

(10) Patent No.: US 10,454,072 B2
(45) Date of Patent: Oct. 22, 2019

(54) ORGANIC LIGHT EMITTING DISPLAY PANEL

(71) Applicant: Samsung Display Co., Ltd., Yongin-si, Gyeonggi-Do (KR)

(72) Inventors: Dae-Woo Lee, Hwaseong-si (KR); Byoung-Ki Kim, Seoul (KR); Ho-Jin Yoon, Hwaseong-si (KR); Yun-Mo Chung, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/946,976

(22) Filed: Apr. 6, 2018

(65) Prior Publication Data

US 2018/0233703 A1     Aug. 16, 2018

Related U.S. Application Data

(63) Continuation of application No. 15/207,321, filed on Jul. 11, 2016, now Pat. No. 9,941,488.

(30) Foreign Application Priority Data

Oct. 13, 2015 (KR) .................. 10-2015-0142716

(51) Int. Cl.
*H01L 29/08* (2006.01)
*H01L 51/52* (2006.01)
*H01L 27/32* (2006.01)

(52) U.S. Cl.
CPC ...... *H01L 51/5271* (2013.01); *H01L 27/3246* (2013.01); *H01L 2227/323* (2013.01); *H01L 2251/5315* (2013.01)

(58) Field of Classification Search
CPC ............... H01L 51/52; H01L 151/5271; H01L 51/5259; H01L 27/3244; H01L 27/3246
See application file for complete search history.

(56) References Cited

U.S. PATENT DOCUMENTS

| 2013/0049028 A1* | 2/2013 | Kim ................ H01L 51/5209 257/88 |
| 2015/0243704 A1* | 8/2015 | Lee .................... H01L 51/56 257/79 |
| 2016/0104859 A1* | 4/2016 | Kim ................ H01L 51/5228 257/40 |
| 2016/0197126 A1* | 7/2016 | Yoo ................. H01L 27/3283 257/40 |

FOREIGN PATENT DOCUMENTS

| KR | 10-0712182 B1 | 4/2007 |
| KR | 10-2009-0099744 A | 9/2009 |

* cited by examiner

*Primary Examiner* — Phuc T Dang
(74) *Attorney, Agent, or Firm* — Innovation Counsel LLP (57) ABSTRACT

An organic light emitting display panel includes a base substrate, a pixel defining layer disposed on the base substrate, a light emitting structure disposed in an opening of the pixel defining layer, and a mirror pattern disposed on an upper surface of the pixel defining layer. The pixel defining layer defines the opening and includes the upper surface that is in parallel with a surface of the base substrate and a side surface that is connected to the upper surface. The mirror pattern makes contact with the pixel defining layer, and entirely covers the upper surface of the pixel defining layer.

8 Claims, 11 Drawing Sheets

ORGANIC LIGHT EMITTING DISPLAY PANEL

This application is a continuation application of U.S. patent application Ser. No. 15/207,321 filed Jul. 11, 2016, now issued as U.S. Pat. No. 9,941,488, which claims priority under 35 U.S.C. § 119 to Korean Patent Application No. 10-2015-0142716, filed on Oct. 13, 2015, the disclosures of which is incorporated by reference herein in its entirety.

BACKGROUND

1. Field

Exemplary embodiments of the inventive concept relate to an organic light emitting display panel and a method of manufacturing the organic light emitting display panel. More particularly, exemplary embodiments of the inventive concept relate to an organic light emitting display panel having a mirror function and a display function and a method of manufacturing the organic light emitting display panel.

2. Description of the Related Art

A display device displays an image using a pixel that emits light. An organic light emitting display device includes a pixel having an organic light emitting diode (OLED). The wavelength of the light emitted by the OLED depends on an organic material included in the OLED. For example, the OLED may include organic material corresponding to one of a red color light, a green color light, and a blue color light. The organic light emitting display device displays the image by mixing the light emitted by the organic materials.

Recently, there are display apparatuses having a mirror function and a display function. However, a traditional display apparatus having a mirror function and a display function generally has a lower display quality than a normal display apparatus without the mirror function.

SUMMARY

One or more exemplary embodiment of the inventive concept provides an organic light emitting display panel having a simple structure and capable of improving display quality and mirror image quality.

One or more exemplary embodiments of the inventive concept also provide a method of manufacturing the organic light emitting display panel.

According to an exemplary embodiment of the inventive concept, an organic light emitting display panel includes a base substrate, a pixel defining layer disposed on the base substrate, a light emitting structure disposed in an opening of the pixel defining layer, and a mirror pattern disposed on an upper surface of the pixel defining layer. The pixel defining layer defines the opening and includes the upper surface that is in parallel with a surface of the base substrate and a side surface that is connected to the upper surface. The mirror pattern makes contact with the pixel defining layer, and entirely covers the upper surface of the pixel defining layer.

In an exemplary embodiment, the organic light emitting display panel may further include a thin film transistor disposed on the base substrate, a first electrode electrically connected to the thin film transistor, and a second electrode facing the first electrode, and disposed on the pixel defining layer, the mirror pattern and the light emitting structure. The mirror pattern may make contact with the second electrode.

In an exemplary embodiment, the mirror pattern may have a shape that is the same as the pixel defining layer in a plan view.

In an exemplary embodiment, the mirror pattern may extend in a first direction and a second direction that crosses the first direction to form a mesh structure.

In an exemplary embodiment, the mirror pattern further may cover a portion of the side surface of the pixel defining layer.

In an exemplary embodiment, the mirror pattern may cover only the upper surface of the pixel defining layer.

In an exemplary embodiment, the pixel defining layer may be formed a material excluding a photosensitive material.

In an exemplary embodiment, the light emitting structure may make contact with the side surface of the pixel defining layer, and be spaced apart from the mirror pattern.

In an exemplary embodiment, the mirror pattern may include at least one or more of aluminum (Al), chrome (Cr), silver (Ag), iron (Fe), platinum (Pt), mercury (Hg), nickel (Ni), tungsten (W), vanadium (V) and molybdenum (Mo).

According to an exemplary embodiment of the inventive concept, a method of manufacturing an organic light emitting display panel includes forming a thin film transistor on a base substrate, forming a preliminary pixel defining layer on the base substrate on which the thin film transistor is formed, forming a pixel defining layer by patterning the preliminary pixel defining layer using a mask, forming a mirror layer on the pixel defining layer, forming a mirror pattern by patterning the mirror layer using the mask that is used for forming the preliminary pixel defining layer, and forming a light emitting structure in an opening of the pixel defining layer. The pixel defining layer defines the opening and includes an upper surface that is in parallel with a surface of the base substrate and a side surface that is connected to the upper surface. The mirror pattern makes contact with the pixel defining layer and entirely covering the upper surface of the pixel defining layer.

In an exemplary embodiment, forming the pixel defining layer may include forming a photoresist layer on the preliminary pixel defining layer, exposing the photoresist layer using the mask, and developing the photoresist layer to form the pixel defining layer.

In an exemplary embodiment, forming the mirror pattern may include forming a photoresist layer on the mirror layer, exposing the photoresist layer using the mask, developing the photoresist layer to form a photoresist pattern, and dry or wet etching the mirror layer using the photoresist pattern as an etch barrier to form the mirror pattern.

In an exemplary embodiment, in exposing the photoresist layer, size of the photoresist pattern may be precisely controlled by adjusting an exposure condition of the photoresist layer.

In an exemplary embodiment, the method may further include forming a first electrode on the thin film transistor, and forming a second electrode on the mirror pattern, the light emitting structure and the pixel defining layer. The mirror pattern may make contact with the second electrode.

In an exemplary embodiment, the mirror pattern may have a shape that is the same as the pixel defining layer in a plan view.

In an exemplary embodiment, the mirror pattern may further cover a portion of the side surface of the pixel defining layer.

In an exemplary embodiment, the mirror pattern may cover only the upper surface of the pixel defining layer.

In an exemplary embodiment, the light emitting structure may be spaced apart from the mirror pattern.

According to an exemplary embodiment of the inventive concept, a method of manufacturing an organic light emitting display panel includes forming a thin film transistor on a base substrate, forming a preliminary pixel defining layer on the base substrate on which the thin film transistor is formed, forming a mirror layer on the preliminary pixel defining layer, forming a pixel defining layer and a mirror pattern by patterning the mirror layer and the preliminary pixel defining layer using a mask, and forming a light emitting structure in an opening of the pixel defining layer. The pixel defining layer defines the opening and includes an upper surface that is in parallel with a surface of the base substrate and a side surface that is connected to the upper surface. The mirror pattern is disposed on an upper surface of the pixel defining layer.

In an exemplary embodiment, the preliminary pixel defining layer may include non-photosensitive material.

According to the present inventive concept, an organic light emitting display apparatus may include a pixel defining layer, a mirror pattern on the pixel defining layer and a second electrode on the mirror pattern. The pixel defining layer and the mirror pattern may be formed using the same mask, so that manufacturing process may be simplified, and manufacturing cost may be reduced.

In addition, the mirror pattern may make contact with the second electrode. Accordingly, the mirror pattern may function as an auxiliary electrode to reduce IR drop of the second electrode.

BRIEF DESCRIPTION OF THE DRAWINGS

The above and other features of the inventive concept will become more apparent by considering the detail exemplary embodiments thereof disclosed herein with reference to the accompanying drawings, in which.

DETAILED DESCRIPTION

Hereinafter, the inventive concept is explained in detail with reference to the accompanying drawings.

Figure 1:
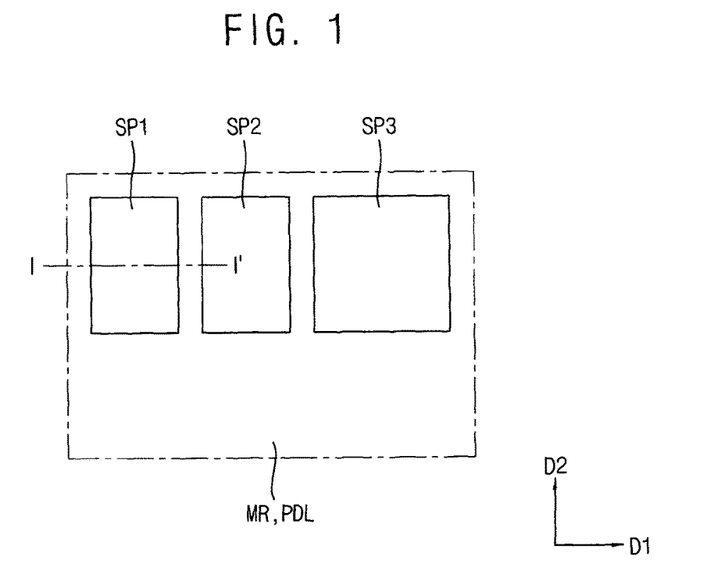
FIG. 1 is a plan view illustrating one pixel of an organic light emitting display panel according to an exemplary embodiment of the inventive concept.
Figure 2:
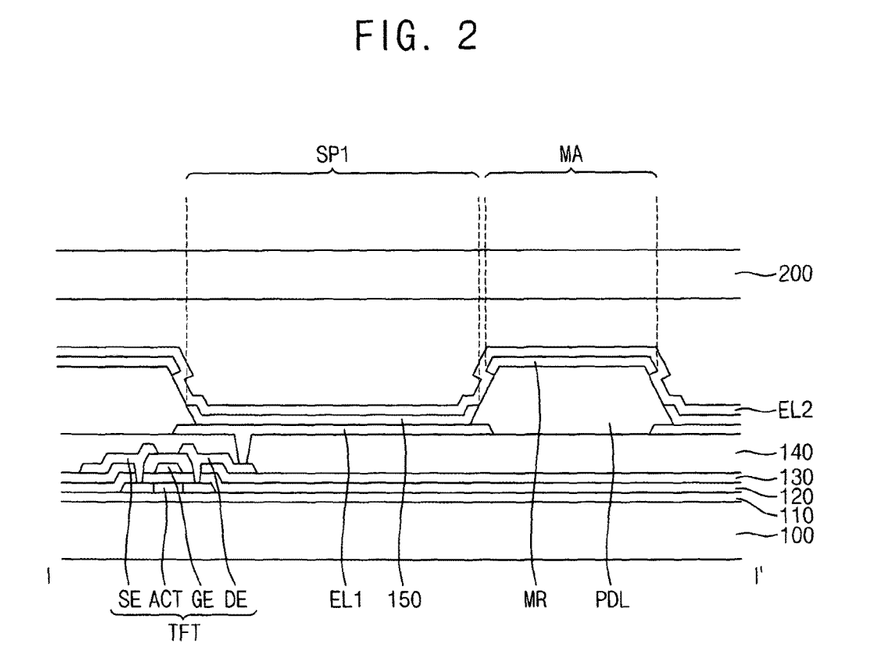
FIG. 2 is a cross-sectional view taken along a line I-I' of FIG. 1.

FIG. 1 is a plan view illustrating one pixel of an organic light emitting display panel according to an exemplary embodiment of the inventive concept. FIG. 2 is a cross-sectional view taken along a line I-I' of FIG. 1.

Referring to FIGS. 1 and 2, the organic light emitting display panel includes a base substrate 100, a buffer layer 110, an active pattern ACT, a first insulation layer 120, a thin film transistor TFT, a second insulation layer 130, a planarization layer 140, a first electrode EL1, a pixel defining layer PDL, a mirror pattern MR, a light emitting structure 150, a second electrode EL2 and a sealing substrate 200.

The base substrate 100 may include a transparent insulation substrate. For example, the base substrate 100 may include a glass substrate, a quartz substrate, a transparent resin substrate, etc. Examples of the transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The buffer layer 110 may be disposed on the base substrate 100. The buffer layer 110 may prevent diffusion of metal atoms and/or impurities from the base substrate 100. Additionally, the buffer layer 110 may adjust the heat transfer rate of a successive crystallization process for the active patterns ACT, which are described layer, to thereby obtain a substantially uniform active pattern ACT. Furthermore, if the base substrate 100 has a relatively irregular surface, the buffer layer 110 may improve the flatness of the surface of the base substrate 100. The buffer layer 110 may be formed using a silicon compound. For example, the buffer layer 110 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), etc. These materials may be used alone or in a mixture thereof. The buffer layer 110 may have a single-layer structure or a multilayer structure. For example, the buffer layer 110 may have a single-layer structure including a silicon oxide film, a silicon nitride film, a silicon oxynitride film, a silicon oxycarbide film or a silicon carbon nitride film. Alternatively, the buffer layer 110 may have a multilayer structure including at least two of a silicon oxide film, a silicon nitride film, a silicon oxynitride film, a silicon oxycarbide film, a silicon carbon nitride film, etc.

The active patterns ACT may be disposed on the buffer layer 110. The active pattern ACT may include source and drain areas that are impurity-doped, and a channel area between the source area and the drain area.

The first insulation layer 120 may be disposed on the base substrate 100 on which the active patterns ACT are disposed. The first insulation layer 120 may include a silicon compound, metal oxide, etc. For example, the first insulation layer 120 may be formed using silicon oxide ($SiO_x$), silicon nitride ($SiN_x$), silicon oxynitride ($SiO_xN_y$), aluminum oxide ($AlO_x$), tantalum oxide ($TaO_x$), hafnium oxide ($HfO_x$), zirconium oxide ($ZrO_x$), titanium oxide ($TiO_x$), etc. These materials may be used alone or in a combination thereof. In addition, the first insulation layer 120 may have a single-layer structure or a multilayer structure including the silicon oxide and/or the silicon nitride. In example embodiments, the first insulation layer 120 may be uniformly formed on the base substrate 100 along a profile of the active patterns ACT. Here, the first insulation layer 120 may have a substantially small thickness, such that a stepped portion may be formed at a portion of the first insulation layer 120 adjacent to the active patterns ACT. In some example embodiments, the first insulation layer 120 may have a relatively large thickness for sufficiently covering the active patterns ACT, and the first insulation layer 120 may have a substantially level surface.

A gate pattern may be disposed on the first insulation layer 120. The gate pattern may include metal, alloy, conductive metal oxide, a transparent conductive material, etc. The gate pattern may include a gate electrode GE overlapped with the active pattern ACT, a signal line such as a gate line configured to transmit signals to drive the pixels, a first storage electrode and etc.

The second insulation layer 130 may be disposed on the first insulation layer 120 on which the gate pattern is disposed. The second insulation layer 130 may insulate the gate electrode GE from a source electrode SE and a drain electrode DE. The second insulation layer 130 may be uniformly formed on the first insulation layer 120 along a profile of the gate pattern. Here, the second insulation layer 130 may have a substantially small thickness, such that a stepped portion may be formed at a portion of the second insulation layer 130 adjacent to the gate pattern. The second insulation layer 130 may include a silicon compound, etc. For example, the second insulation layer 130 may be formed using silicon oxide (SiOx), silicon nitride (SiNx), silicon oxynitride (SiOxNy), etc.

A data pattern may be disposed on the second insulation layer 130. The data pattern may include the source electrode SE, the drain electrode DE, a signal line, such as a data line configured to transmit signals to drive the pixels, a second storage electrode and etc. The source electrode SE may be electrically connected to the active pattern ACT through a contact hole formed through the first and second insulation layers 120 and 130.

The active pattern ACT, the gate electrode GE, the source electrode SE and the drain electrode DE may be included in the thin film transistor TFT.

The planarization layer 140 may be disposed on the second insulation layer 130 on which the thin film transistors TFT are disposed. The planarization layer 140 may have a single-layer structure or a multilayer structure including at least two insulation films. The planarization layer 140 may be may be formed using an organic material. For example, the planarization layer 140 may include photoresist, acryl-based resin, polyimide-based resin, polyamide-based resin, siloxane-based resin, etc. These materials may be used alone or in a combination thereof. Alternatively, the planarization layer 140 may include an inorganic material. For example, the planarization layer 140 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These materials may be used alone or in a mixture thereof.

The first electrode EL1 may be disposed on the planarization layer 140. The first electrode EL1 may be connected to the drain electrode DE through a contact hole that is formed through the planarization layer 140.

In some example embodiments, a contact, a plug or a pad may be formed in the contact hole, and then the first electrode EL1 may be formed on the contact, the plug or the pad. Here, the first electrode EL1 may be electrically connected to the drain electrode DE through the contact, the plug or the pad.

The display apparatus has a front emission type structure, so the first electrode EL1 may include a reflective material. For example, the first electrode EL1 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in a combination thereof. In example embodiments, the first electrode EL1 may have a single-layer structure or a multilayer structure.

The pixel defining layer PDL may be disposed on the planarization layer 140 on which the first electrode EL1 is formed. The pixel defining layer PDL may define an opening to expose a portion of the first electrode EL1. The pixel defining layer PDL may include a transparent organic material or a transparent inorganic material. For example, the pixel defining layer PDL may be formed using photoresist, acryl-based resin, polyacryl-based resin, polyimide-based resin, a silicon compound, etc.

The pixel defining layer PDL may include an upper surface that is in parallel with a surface of the base substrate 100 and a side surface that is connected to the upper surface. The side surface may be inclined to the upper surface.

The mirror pattern MR may be disposed on the pixel defining layer PDL. The mirror pattern MR may include a material having high reflectivity, such as metal, to reflect external light. For example, the mirror pattern MR may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the mirror pattern MR may have a multilayer structure having a transparent conductive metal oxide layer and a metal layer. For example, the mirror pattern MR may include ITO/Ag/ITO triple layers.

The mirror pattern MR may have a shape substantially the same as the pixel defining layer PDL in a plan view. In addition, the mirror pattern MR may entirely cover the upper surface of the pixel defining layer PDL. In addition, a boundary of the mirror pattern MR may cover a portion of the side surface of the pixel defining layer PDL. The mirror pattern MR may be formed on only the upper surface of the pixel defining layer PDL and may cover the portion of the side surface of the pixel defining layer PDL due to a fabrication error, etc.

The light emitting structure 150 may be disposed on the first electrode EL1 that is exposed through the opening of the pixel defining layer PDL. The light emitting structure 150 may extend on a sidewall of the opening of the pixel defining layer PDL. The light emitting structure 150 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light, such as a red color of light, a green color of light and a blue color of light, in accordance with color pixels of the display device. In some example embodiments, the organic light emitting layer of the of the light emitting structure 150 may include a plurality of stacked light emitting materials for generating a red color of light, a green color of light and a blue color of light to thereby emit a white color of light. In some example embodiment, the EL of the light emitting structure 150 may be disposed corresponding to each of pixels, and the HIL, the HTL, the ETL, the EIL, etc. may be commonly disposed corresponding to a plurality of pixels.

The second electrode EL2 may be disposed on the pixel defining layer PDL and the light emitting structure 150. The display apparatus has a front emission type structure, so the second electrode EL2 may include a transmissive material. For example, the second electrode EL2 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in a combination thereof. In example embodiments, the second electrode EL2 may also have a single-layer structure or a multilayer structure, which may include a metal film, an alloy film, a metal nitride film, a conductive metal oxide film and/or a transparent conductive film.

First to third sub pixels SP1, SP2 and SP3 may correspond to a light emitting area, and an area where the mirror pattern MR is disposed may correspond to a mirror area MA that reflects external light. In a plan view, the mirror pattern MR has a shape substantially the same as the pixel defining layer PDL, and the mirror area MA may be formed between the sub pixels that are adjacent to each other in the first direction D1, and between the sub pixels that are adjacent to each other in the second direction D2.

The mirror pattern MR may make contact with the second electrode EL1. In a plan view, the mirror pattern MR has a shape substantially the same as the pixel defining layer PDL. The mirror pattern MR may function as an auxiliary electrode to reduce IR drop of the second electrode EL2. In addition, the mirror pattern MR may form a mesh structure in the first and second directions D1 and D2, so that electric potential of the second electrode EL2 may be efficiently maintained.

The sealing substrate 200 may be disposed on the second electrode EL2. The sealing substrate 200 may include a transparent material and be configured to prevent ambient air and moisture from permeating into the transparent organic light emitting display apparatus. The sealing substrate 200 may be combined with the base substrate 100 to seal space between the base substrate 100 and the sealing substrate 200 by using a sealing agent (not shown).

A desiccant or a filler may be filled into the space. A thin sealing film instead of the sealing substrate 200 may be formed on the second electrode EL2 to protect the second electrode and the light emitting structure form ambient air and moisture. The sealing film has a structure in which a layer formed of an inorganic material, such as silicon oxide or silicon nitride, and a layer such as epoxy or polyimide are alternately stacked. However, aspects of the present invention are not limited thereto, and the structure of the sealing film may be one of any sealing structure in the form of a transparent thin film.

Figure 3:
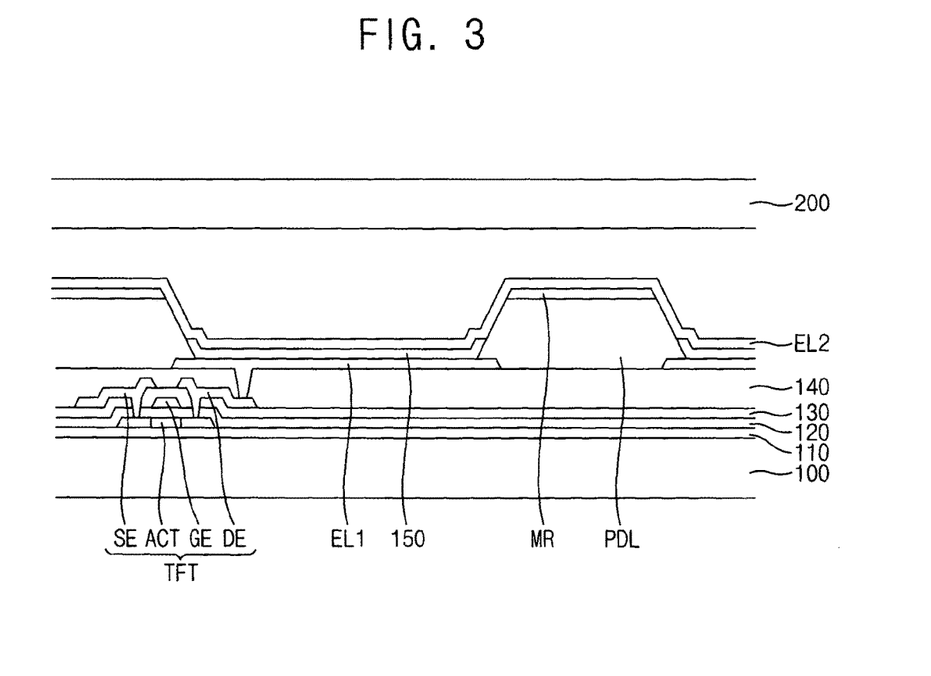
FIG. 3 is a cross-sectional view illustrating an organic light emitting display panel according to an exemplary embodiment of the inventive concept.

FIG. 3 is a cross-sectional view illustrating an organic light emitting display panel according to an exemplary embodiment of the inventive concept.

Referring to FIG. 3, the organic light emitting display panel is substantially the same as the organic light emitting display panel of FIG. 2 except for a mirror pattern MR. Thus, any further detailed descriptions concerning the same elements are briefly described or omitted.

The organic light emitting display panel includes a base substrate 100, an active pattern ACT, a buffer layer 110, a first insulation layer 120, a thin film transistor TFT, a second insulation layer 130, a planarization layer 140, a first electrode EL1, a pixel defining layer PDL, a mirror pattern MR, a light emitting structure 150, a second electrode EL2 and a sealing substrate 200.

The base substrate 100 may include a transparent insulation substrate. The buffer layer 110 may be disposed on the base substrate 100. The active patterns ACT may be disposed on the buffer layer 110. The first insulation layer 120 may be disposed on the base substrate 100 on which the active patterns ACT are disposed. A gate pattern including a gate electrode GE may be disposed on the first insulation layer 120. The second insulation layer 130 may be disposed on the first insulation layer 120 on which the gate pattern is disposed. A data pattern including a source electrode SE and a drain electrode DE may be disposed on the second insulation layer 130. The active pattern ACT, the gate electrode GE, the source electrode SE and the drain electrode DE may be included in the thin film transistor TFT. The planarization layer 140 may be disposed on the second insulation layer 130 on which the thin film transistors TFT are disposed. The first electrode EL1 may be disposed on the planarization layer 140.

The pixel defining layer PDL may be disposed on the planarization layer 140 on which the first electrode EL1 is formed. The pixel defining layer PDL may define an opening to expose a portion of the first electrode EL1. The pixel defining layer PDL may include an organic material or an inorganic material that do not include photosensitive material. For example, the pixel defining layer PDL may be formed using polyimide-based resin, etc.

The pixel defining layer PDL may include an upper surface that is in parallel with a surface of the base substrate 100 and a side surface that is connected to the upper surface. The side surface may be inclined to the upper surface.

The mirror pattern MR may be disposed on the pixel defining layer PDL. The mirror pattern MR may include a material having high reflectivity, such as metal, to reflect external light. For example, the mirror pattern MR may include aluminum (Al), chrome (Cr), silver (Ag), iron (Fe), platinum (Pt), mercury (Hg), nickel (Ni), tungsten (W), vanadium (V), molybdenum (Mo) and etc. In some example embodiment, the mirror pattern MR may have multilayer structure having transparent conductive metal oxide layer and metal layer. For example, the mirror pattern MR may include ITO/Ag/ITO triple layers.

The mirror pattern MR may have a shape substantially the same as the pixel defining layer PDL in a plan view. In addition, the mirror pattern MR may entirely cover the upper surface of the pixel defining layer PDL. Thus, the mirror pattern MR may be formed on the upper surface of the pixel defining layer PDL.

The light emitting structure 150 may be disposed on the first electrode EL1 that is exposed through the opening of the pixel defining layer PDL. The second electrode EL2 may be disposed on the pixel defining layer PDL and the light emitting structure 150. The sealing substrate 200 may be disposed on the second electrode EL2.

FIGS. 4A to 4I are cross-sectional views illustrating a method of manufacturing the organic light emitting display panel of FIG. 2.

Figure 4A:
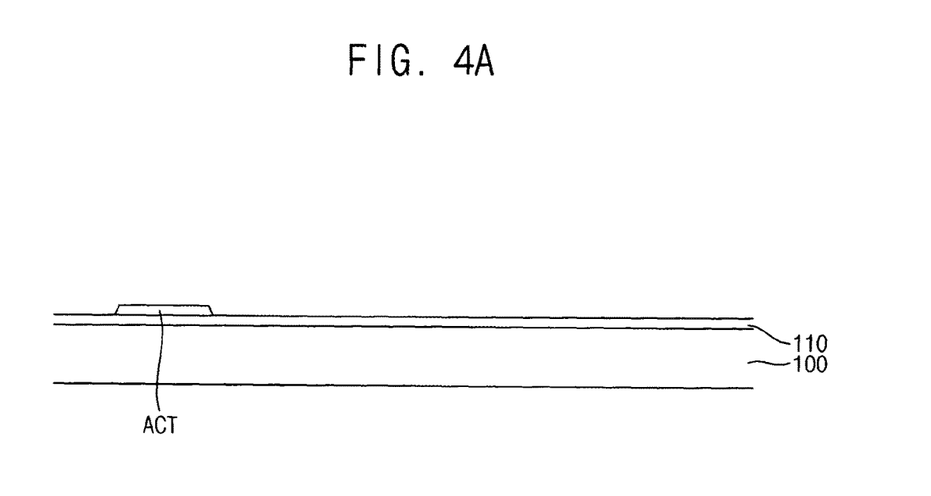
FIGS. 4A, 4B, 4C, 4D, 4E, 4F, 4G, 4H, 4I, 4J, 4K and 4L are cross-sectional views illustrating a method of manufacturing the organic light emitting display panel of FIG. 2.

Referring to FIG. 4A, a buffer layer 110 may be formed on a base substrate 100. The buffer layer 110 may be formed by a spin coating process, a chemical vapor deposition (CVD) process, a plasma enhanced chemical vapor deposition (PECVD) process, a high density plasma-chemical vapor deposition (HDP-CVD) process, a printing process, etc.

An active pattern ACT may be formed on the buffer layer 110. A semiconductor layer (not illustrated) may be formed on the buffer layer 110, and then a preliminary active layer (not illustrated) may be formed on the buffer layer 110 by patterning the semiconductor layer. A crystallization process may be performed about the preliminary active layer to form the active pattern ACT on the buffer layer 110. Here, the semiconductor layer may be formed by a CVD process, a PECVD process, a low pressure chemical vapor deposition (LPCVD) process, a sputtering process, a printing process, etc. If the semiconductor layer includes amorphous silicon, the active pattern ACT may include polysilicon. The crystallization process for forming the active pattern ACT may include a laser irradiation process, a thermal treatment process, a thermal process utilizing a catalyst, etc. In some example embodiments, a dehydrogenation process may be performed about the semiconductor layer and/or the preliminary active layer after forming the semiconductor layer and/or the preliminary active layer on the buffer layer 110. The dehydrogenation process may reduce the hydrogen concentration of the semiconductor layer and/or the preliminary active layer, so that the active pattern ACT may have improved electrical characteristics.

Figure 4B:
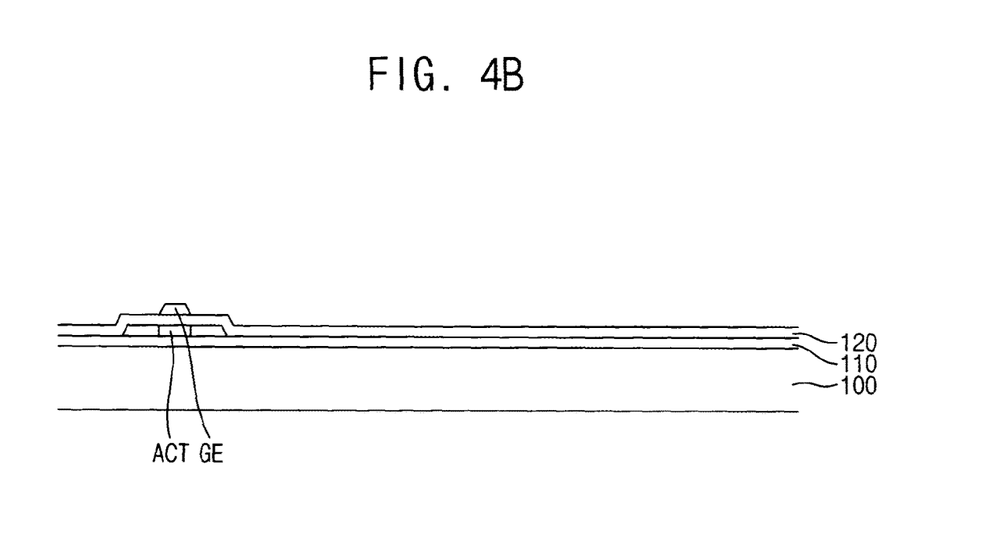

Referring to FIG. 4B, a first insulation layer 120 may be formed on the buffer layer 110 on which the active pattern ACT is formed. The first insulation layer 120 may be formed by a CVD process, a spin coating process, a PECVD process, a sputtering process, a vacuum evaporation process, an HDP-CVD process, a printing process, etc.

A gate pattern which includes a gate electrode GE may be formed on the first insulation layer 120. In example embodiments, a first conductive layer (not illustrated) may be formed on the first insulation layer 120, and then the first conductive layer may be partially etched by a photolithography process or an etching process using an additional etching mask. Hence, the gate pattern may be provided on the first insulation layer 120.

Figure 4C:
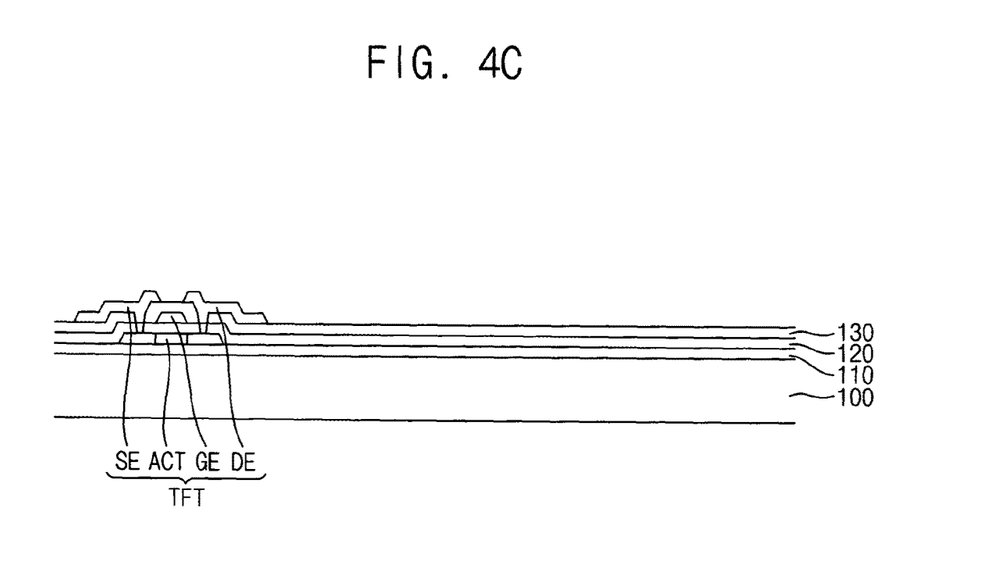

Referring to FIG. 4C, a second insulation layer 130 may be formed on the first insulation layer 120 on which the gate pattern is formed. The second insulation layer 130 may be formed by a CVD process, a spin coating process, a PECVD process, a sputtering process, a vacuum evaporation process, an HDP-CVD process, a printing process, etc.

A data pattern including a source electrode SE and a drain electrode DE may be formed on the second insulation layer 130. Contact holes exposing the active pattern ACT may be formed by partially etching the second insulation layer 130 and the first insulation layer 120. A second conductive layer (not illustrated) may be formed on the second insulation layer 130 to fill the contact holes, and then the data pattern may be formed by patterning the second conductive layer.

Figure 4D:
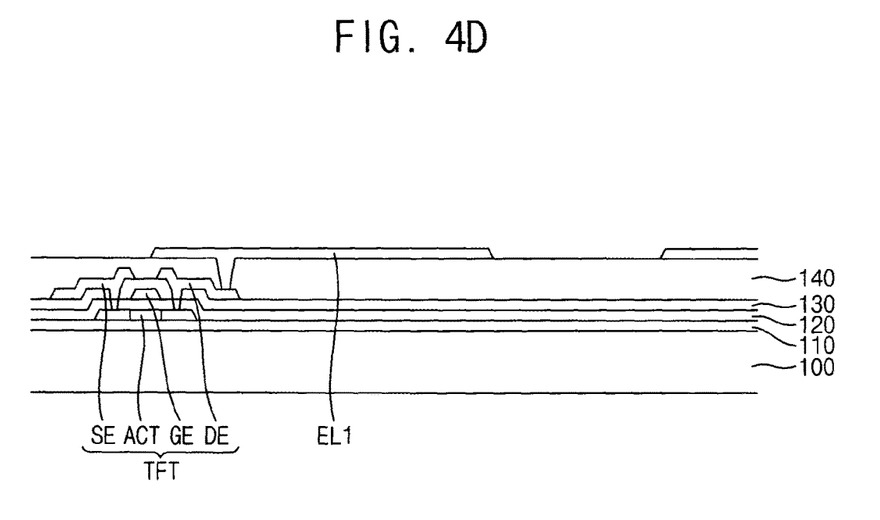

Referring to FIG. 4D, a planarization layer 140 may be formed on the second insulation layer 130 on which the data pattern is formed. The planarization layer 140 may be obtained by a spin coating process, a printing process, a sputtering process, a CVD process, an ALD process, a PECVD process, an HDP-CVD process or a vacuum evaporation process in accordance with ingredients included in the planarization layer 140.

In example embodiments, a planarization process may be executed on planarization layer 140 to enhance the flatness of the planarization layer 140. For example, the planarization layer 140 may have a substantially level surface by a chemical mechanical polishing (CMP) process, an etch-back process, etc.

A first electrode EL1 may be formed on the planarization layer 140. The planarization layer 140 may be partially etched by a photolithography process or an etching process using an additional mask to form a contact hole that exposes the drain electrode DE of the thin film transistor TFT through the planarization layer 140.

In example embodiments, the contact hole may have a sidewall inclined by a predetermined angle relative to the base substrate 100. For example, the contact hole may have an upper width substantially larger than a lower width thereof.

The first electrode EL1 may be formed on the planarization layer 140 to fill the contact hole. The first electrode EL1 may make contact with the drain electrode DE through the contact hole. For example, a pixel electrode layer may be formed on the planarization layer 140, and then the pixel electrode layer may be partially etched by a photolithography process or an etching process using an additional mask. Hence, the first electrode EL1 may be formed. The pixel electrode layer may be formed by a printing process, a sputtering process, a CVD process, a PDL process, a vacuum evaporation process, an ALD process, etc.

Figure 4E:
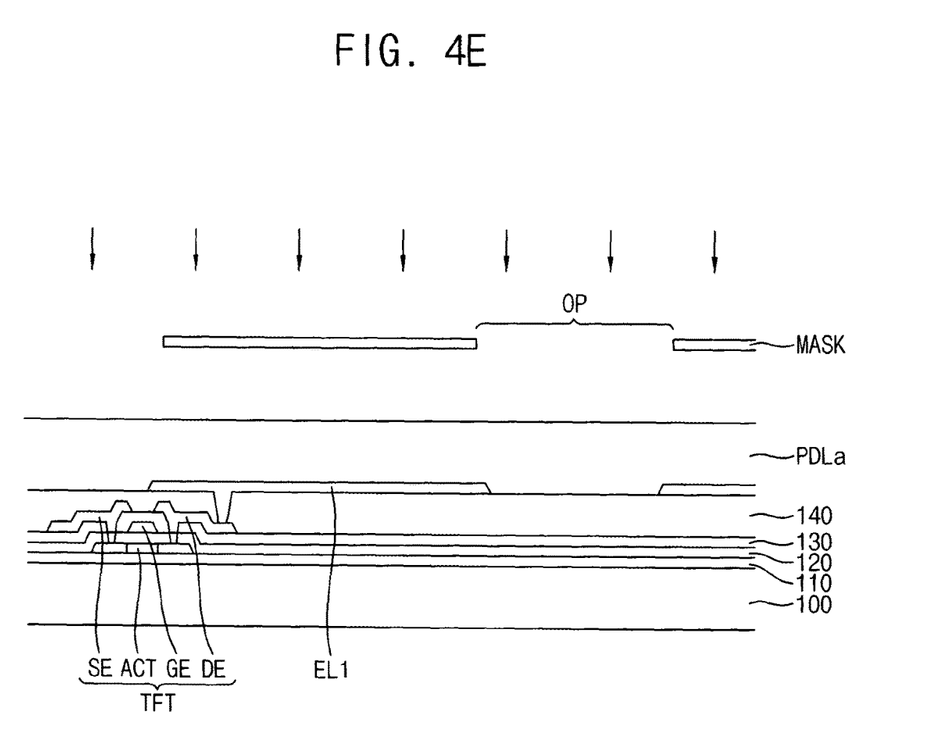
Figure 4F:
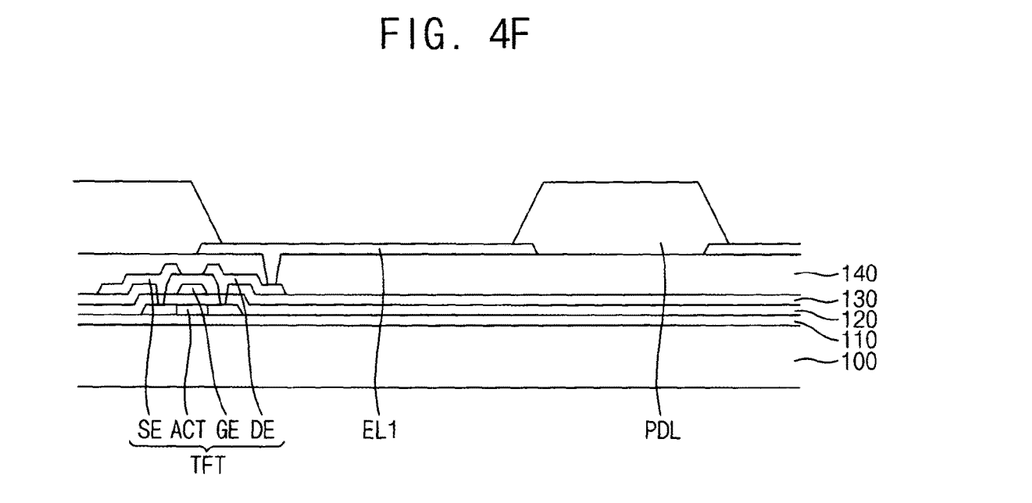

Referring to FIGS. 4E and 4F, a preliminary pixel defining layer PDLa may be formed on the planarization layer 140 on which the first electrode EL1 is formed. The preliminary pixel defining layer PDLa may be formed by a spin coating process, a spray process, a printing process, a CVD process, etc. The preliminary pixel defining layer PDLa may include a photosensitive material.

A pixel defining layer PDL may be formed by patterning the preliminary pixel defining layer PDLa. For example, the preliminary pixel defining layer PDLa may be exposed using a mask MASK and developed using a developer, so that the pixel defining layer PDL may be formed. The mask MASK may define an opening OP. When the preliminary pixel defining layer PDLa includes negative type photoresist, a portion of the preliminary pixel defining layer PDLa where it is exposed through the opening OP of the mask MASK may be maintained, so that the pixel defining layer PDL may be formed.

Figure 4G:
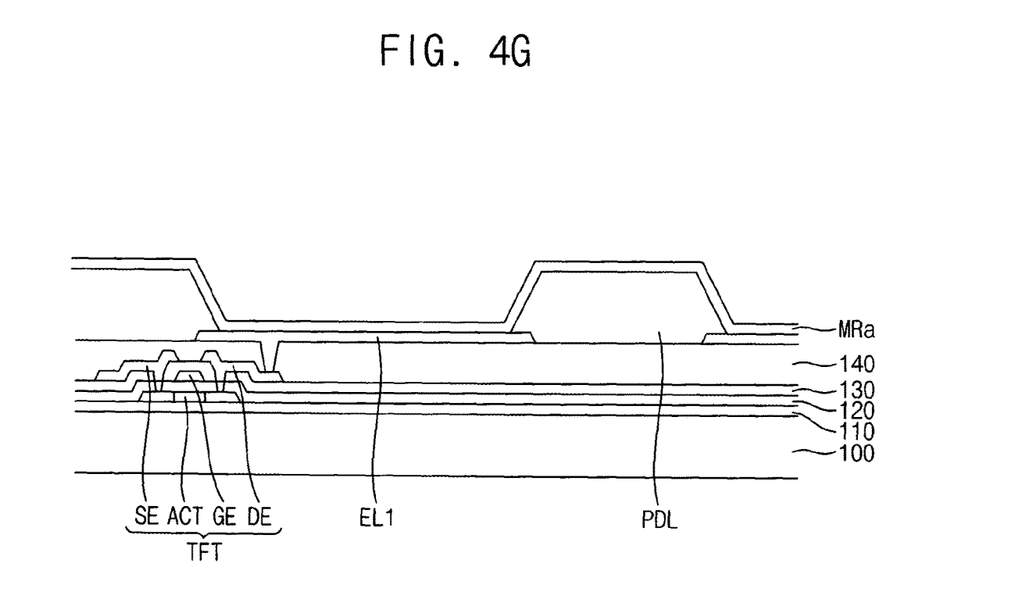

Referring to FIG. 4G, a mirror layer MRa may be formed on the pixel defining layer PDL and the first electrode EL1. The mirror layer MRa may include metal such as aluminum (Al), chrome (Cr), silver (Ag), iron (Fe), platinum (Pt), mercury (Hg), nickel (Ni), tungsten (W), vanadium (V) and molybdenum (Mo) and etc.

Figure 4H:
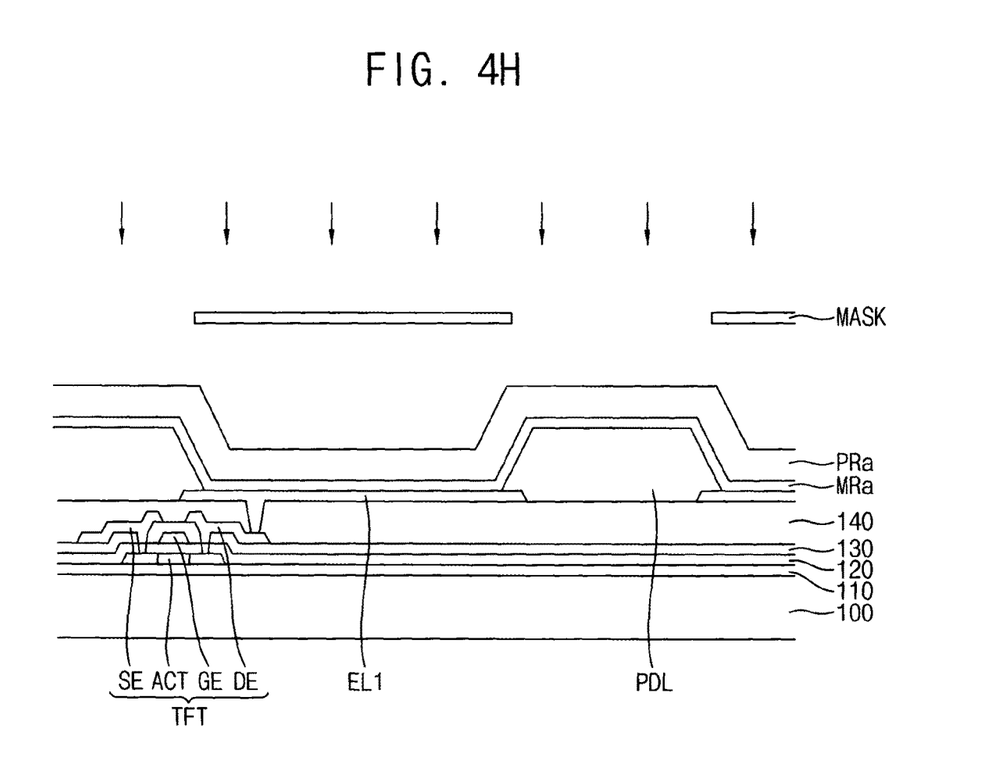
Figure 4I:
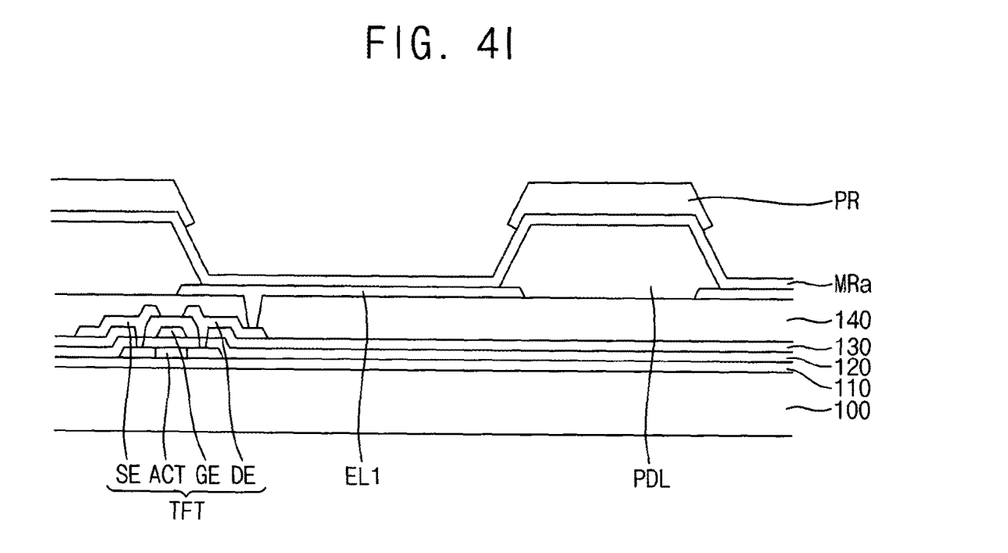

Referring to FIGS. 4H and 4I, a photoresist layer PRa may be formed on the mirror layer MRa. The photoresist layer PRa may be exposed using the mask MASK and developed using a developer, so that a photoresist pattern PR may be formed on the pixel defining layer PDL and the mirror layer MRa. The mask MASK may be the same mask that is used to form the pixel defining layer PDL (refers to FIG. 4E), so that the pixel defining layer PDL and the photoresist layer PR may have pattern shapes substantially the same as each other. The photoresist pattern PR may be formed to entirely cover the mirror layer MRa on an upper surface of the pixel defining layer PDL. Here, a boundary of the photoresist pattern PR may cover a portion of the mirror layer MRa on a side surface of the pixel defining layer PDL.

The photoresist pattern PR and the pixel defining layer PDL may be formed using the same mask MASK, so that manufacturing process may be simplified, and manufacturing cost may be reduced. Although using the same mask, size of the photoresist pattern PR may be precisely controlled by finely adjusting one or more exposure conditions (ex. under exposure or over exposure). Thus, the boundary of the photoresist pattern PR may be formed on the upper surface and/or the portion of the side surface of the pixel defining layer PDL according to a process condition.

Figure 4J:
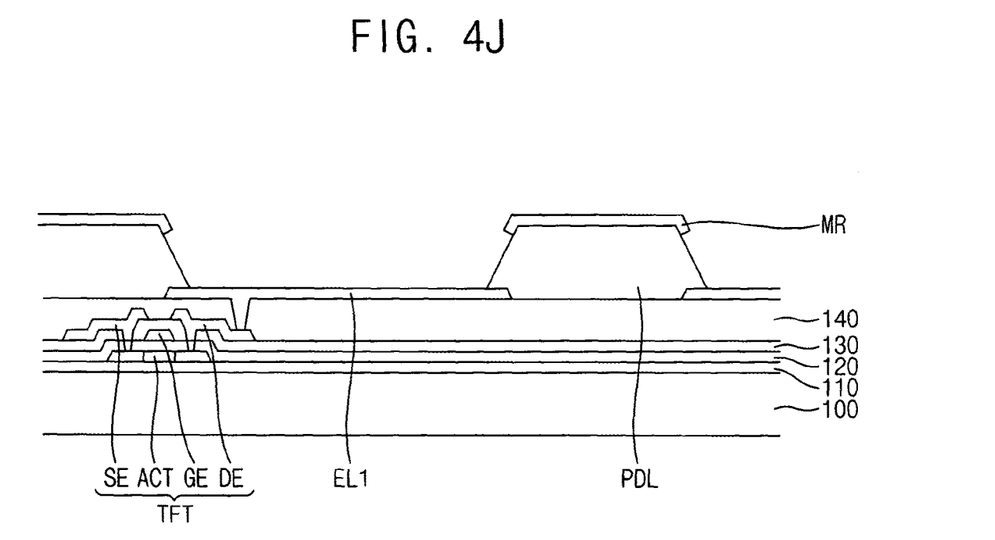

Referring to FIG. 4J, a mirror pattern MR may be formed by patterning the mirror layer MRa using the photoresist pattern PR as a mask. For example, the mirror layer MRa may be dry or wet etched using the photoresist pattern PR as an etch barrier. Accordingly, the mirror pattern MR may be formed.

In a plan view, the mirror pattern MR may have substantially the same shape as the pixel defining layer PDL. In addition, the mirror pattern MR may entirely cover the upper surface of the pixel defining layer PDL. In addition, a boundary of the mirror pattern MR may cover a portion of the side surface of the pixel defining layer PDL. The mirror pattern MR may preferably be formed on only the upper surface of the pixel defining layer PDL, and the mirror pattern MR may cover the portion of the side surface of the pixel defining layer PDL due to a fabrication error, etc.

Figure 4K:
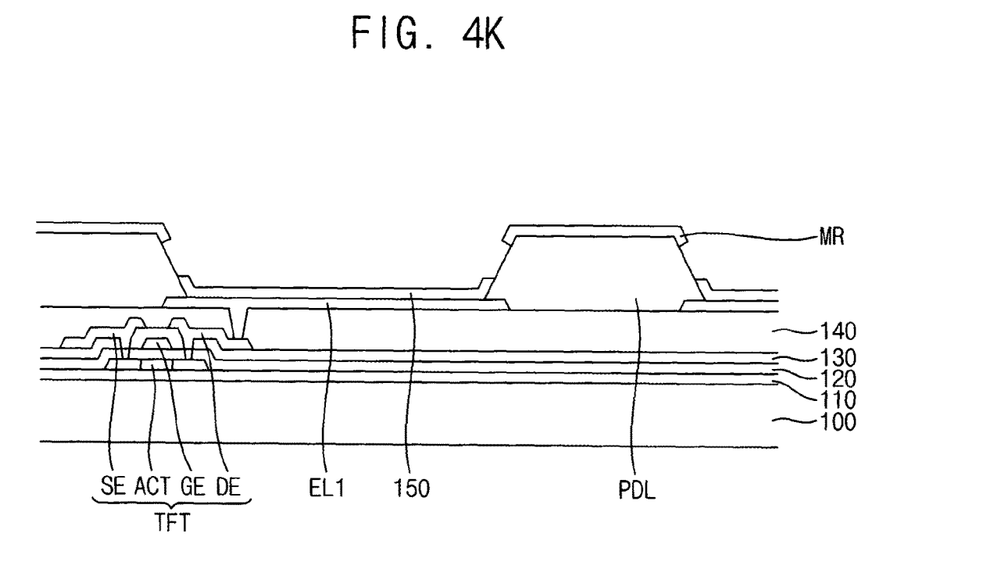

Referring to FIG. 4K, a light emitting structure 150 may be formed on the first electrode EL1. The light emitting structure 150 may be formed by a laser induced thermal imaging process, a printing process, etc. The light emitting structure 150 may extend on a sidewall of the opening of the pixel defining layer PDL. The light emitting structure 150 may be spaced apart from and may not be in contacted with the mirror pattern MR.

Figure 4L:
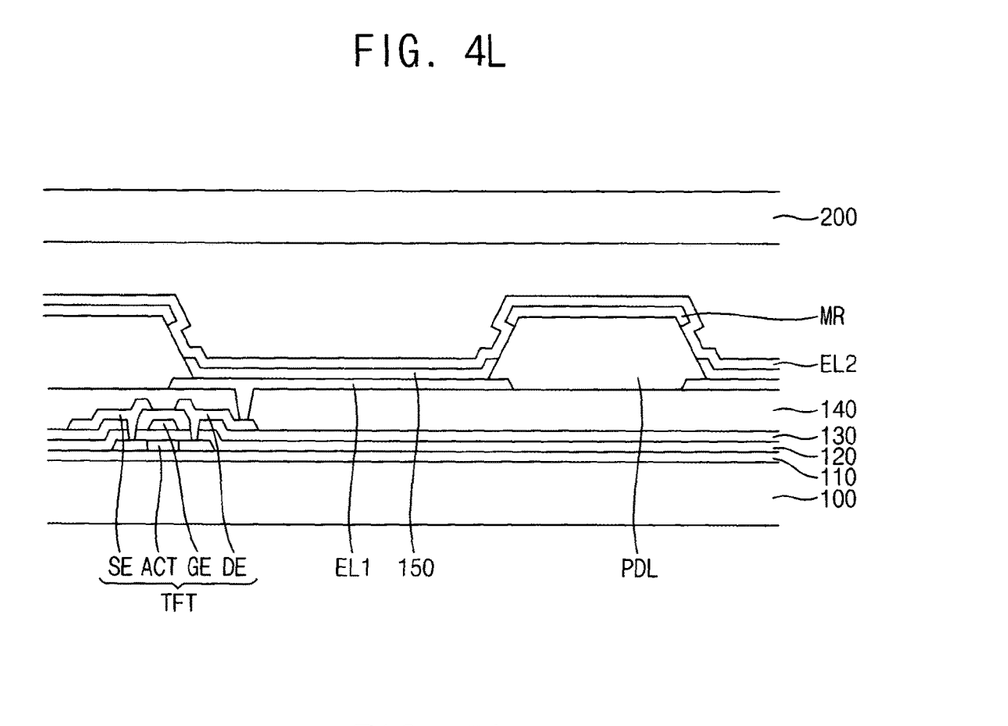

Referring to FIG. 4L, a second electrode EL2 may be formed on the light emitting structure 150, the pixel defining layer PDL and the mirror pattern MR. The second electrode EL2 may be formed by a printing process, a sputtering process, a CVD process, a PDL process, a vacuum evaporation process, an ALD process, etc.

And then, the second electrode EL2 may be sealed from outside by a sealing substrate 200. The sealing substrate 200 may include a transparent material and be configured to prevent ambient air and moisture from permeating into the transparent organic light emitting display apparatus. The sealing substrate 200 may be combined with the base substrate 100 to seal space between the base substrate 100 and the sealing substrate 200 by using a sealing agent (not shown).

FIGS. 5A to 5F are cross-sectional views illustrating a method of manufacturing the organic light emitting display panel of FIG. 3.

Figure 5A:
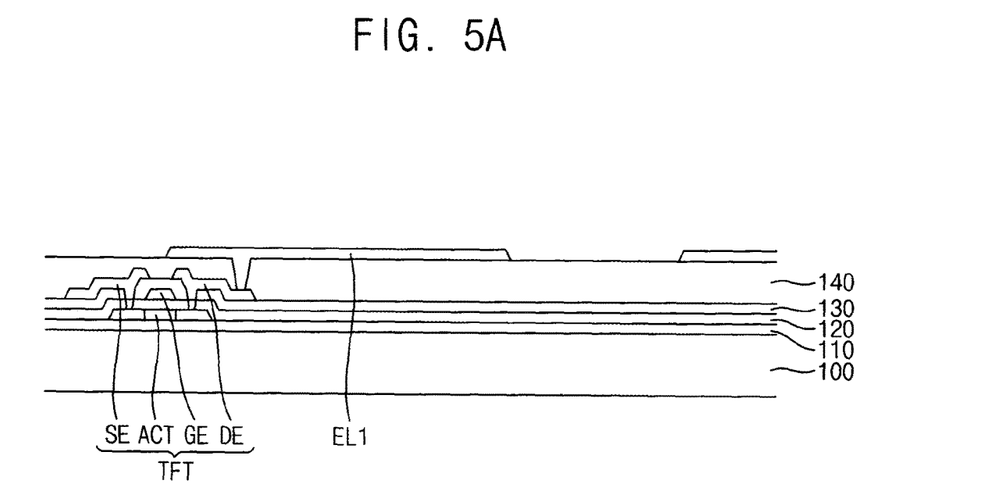
FIGS. 5A, 5B, 5C, 5D, 5E and 5F are cross-sectional views illustrating a method of manufacturing the organic light emitting display panel of FIG. 3.

Referring to FIG. 5A, a buffer layer 110 may be formed on a base substrate 100. An active pattern ACT may be formed on the buffer layer 110. A first insulation layer 120 may be formed on the buffer layer 110 on which the active pattern ACT is formed. A gate pattern which includes a gate electrode GE may be formed on the first insulation layer 120. A second insulation layer 130 may be formed on the first insulation layer 120 on which the gate pattern is formed. A data pattern including a source electrode SE and a drain electrode DE may be formed on the second insulation layer 130. A planarization layer 140 may be formed on the second insulation layer 130 on which the data pattern is formed. A first electrode EL1 may be formed on the planarization layer 140.

The above process may be substantially same as process described in FIGS. 4A to 4D.

Figure 5B:
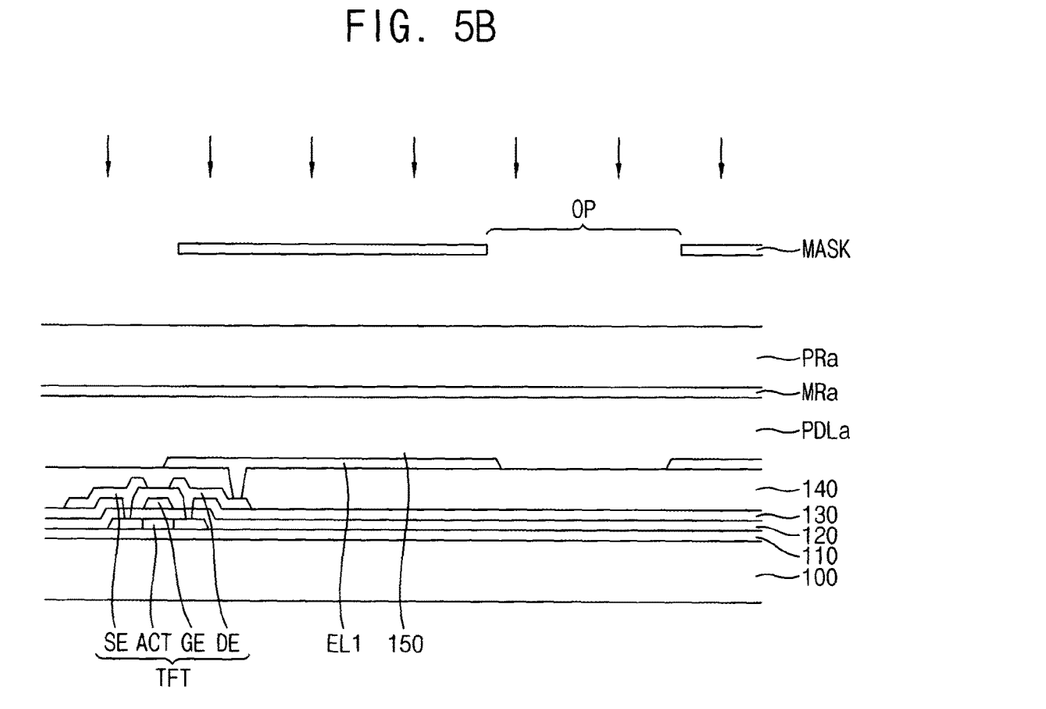
Figure 5C:
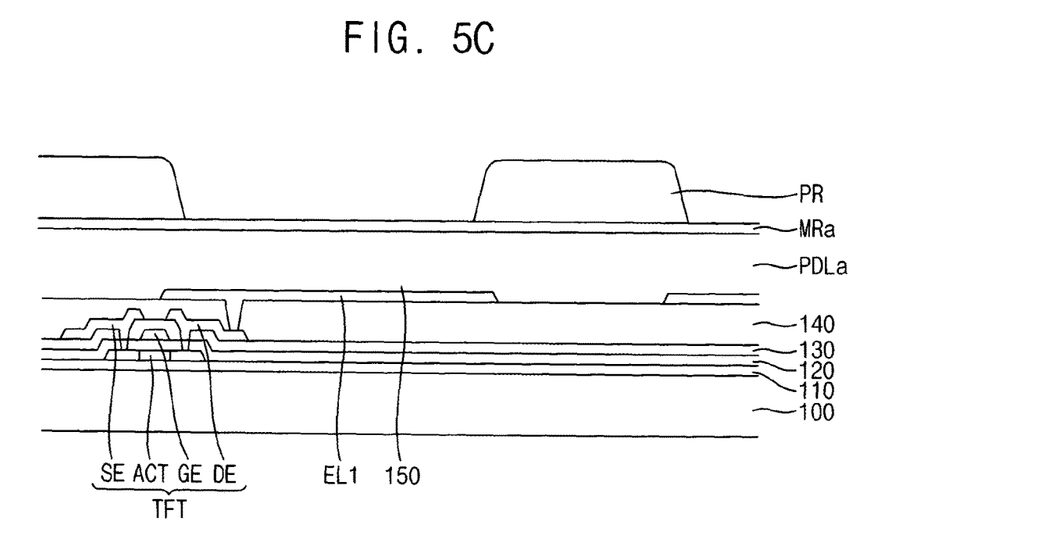

Referring to FIGS. 5B and 5C, a preliminary pixel defining layer PDLa may be formed on the planarization layer 140 on which the first electrode EL1 is formed. The preliminary pixel defining layer PDLa may be formed by a spin coating process, a spray process, a printing process, a CVD process, etc. The preliminary pixel defining layer PDLa may include a photosensitive material.

A mirror layer MRa may be formed on the preliminary pixel defining layer PDLa. The mirror MRa may include metal such as aluminum (Al), chrome (Cr), silver (Ag), iron (Fe), platinum (Pt), mercury (Hg), nickel (Ni), tungsten (W), vanadium (V) and molybdenum (Mo) and etc.

A photoresist layer PRa may be formed on the mirror layer MRa. The photoresist layer PRa may be exposed using the mask MASK and developed using a developer, so that a photoresist pattern PR may be formed on the preliminary pixel defining layer PDLa and the mirror layer MRa. The mask MASK may define an opening OP. When the photoresist layer PRa includes negative type photoresist, a portion of the photoresist layer PRa where it is exposed through the opening OP of the mask MASK may be maintained, so that a photoresist layer PR may be formed.

Figure 5D:
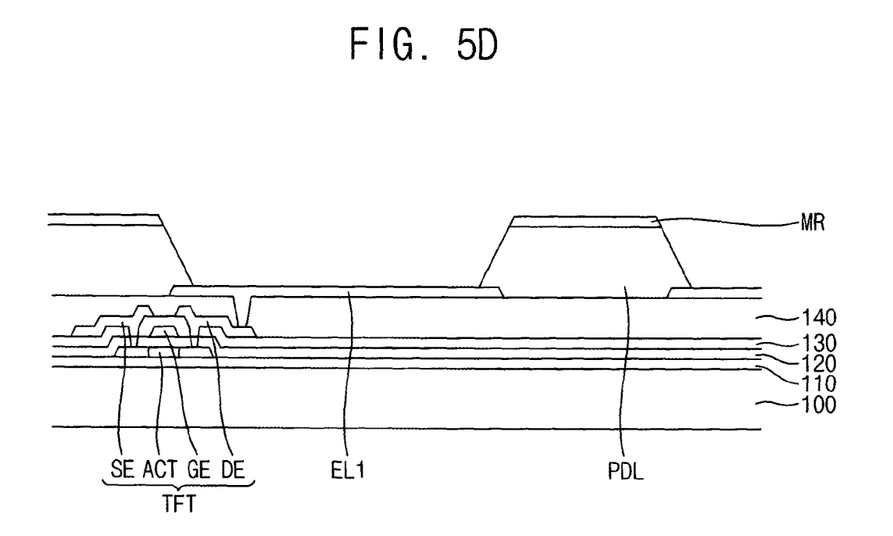

Referring to FIG. 5D, a mirror pattern MR and a pixel defining layer PDL may be formed by patterning the mirror layer MRa and the preliminary pixel defining layer PDLa using the photoresist pattern PR as a mask. For example, the mirror layer MRa and the preliminary pixel defining layer PDLa may be dry or wet etched using the photoresist pattern PR as an etch barrier. Accordingly, the mirror pattern MR and the pixel defining layer PDL may be formed, and the mirror pattern MR may be formed only on an upper surface of the pixel defining layer PDL.

Figure 5E:
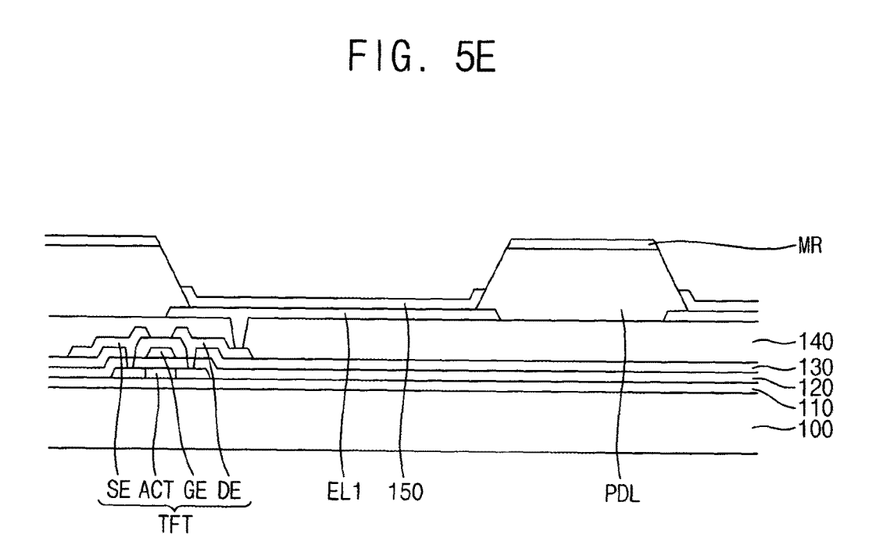

Referring to FIG. 5E, a light emitting structure 150 may be formed on the first electrode EL1. The light emitting structure 150 may be formed by a laser induced thermal imaging process, a printing process, etc. The light emitting structure 150 may extend on a sidewall of the opening of the pixel defining layer PDL. The light emitting structure 150 may be spaced apart from and may not be in contact with the mirror pattern MR.

Figure 5F:
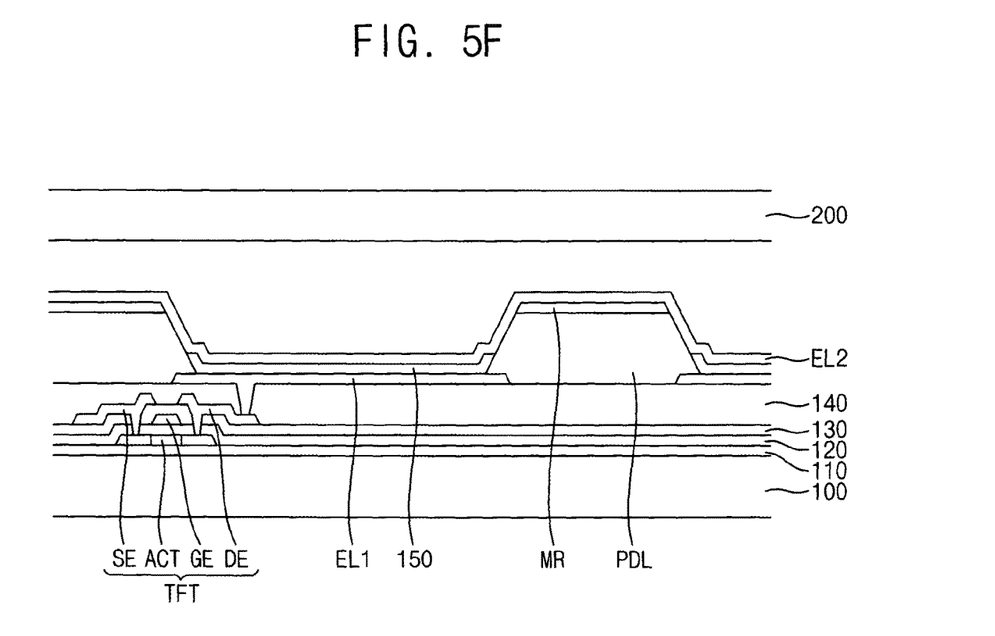

Referring to FIG. 5F, a second electrode EL2 may be formed on the light emitting structure 150, the pixel defining layer PDL and the mirror pattern MR. The second electrode EL2 may be formed by a printing process, a sputtering process, a CVD process, a PDL process, a vacuum evaporation process, an ALD process, etc.

And then, the second electrode EL2 may be sealed from outside by a sealing substrate 200. The sealing substrate 200 may include a transparent material and be configured to prevent ambient air and moisture from permeating into the transparent organic light emitting display apparatus. The sealing substrate 200 may be combined to the base substrate 100 to seal space between the base substrate 100 and the sealing substrate 200 by using a sealing agent (not shown).

According to the present inventive concept, an organic light emitting display apparatus may include a pixel defining layer, a mirror pattern on the pixel defining layer and a second electrode on the mirror pattern. The pixel defining layer and the mirror pattern may be formed using the same mask, so that manufacturing process may be simplified, and manufacturing cost may be reduced.

In addition, the mirror pattern may make contact with the second electrode. Accordingly, the mirror pattern may function as an auxiliary electrode to reduce IR drop of the second electrode EL2.

The foregoing is illustrative of the inventive concept and is not to be construed as limiting thereof. Although a few exemplary embodiments of the inventive concept have been described, those skilled in the art would readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. An organic light emitting display panel, comprising:
   a base substrate;
   a thin film transistor disposed on the base substrate;
   a first electrode electrically connected to the thin film transistor;
   a pixel defining layer disposed on the base substrate, defining an opening and comprising an upper surface that is in parallel with a surface of the base substrate and a side surface that is connected to the upper surface and forms a plane surface;
   a light emitting structure disposed in the opening of the pixel defining layer on the first electrode;
   a mirror pattern which reflects external light and is disposed on the upper surface of the pixel defining layer; and
   a second electrode disposed on the light emitting layer, the pixel defining layer and the mirror pattern, and overlapping the mirror pattern,
   wherein the mirror pattern entirely covers the upper surface of the pixel defining layer.

2. The organic light emitting display panel of claim 1, wherein the mirror pattern makes contact with the second electrode.

3. The organic light emitting display panel of claim 2, wherein the mirror pattern has a shape that is the same as the pixel defining layer in a plan view.

4. The organic light emitting display panel of claim 3, wherein the mirror pattern extends in a first direction and a second direction that crosses the first direction to form a mesh structure.

5. The organic light emitting display panel of claim 1, wherein the mirror pattern further covers a portion of the side surface of the pixel defining layer.

6. The organic light emitting display panel of claim 1, wherein the mirror pattern covers only the upper surface of the pixel defining layer.

7. The organic light emitting display panel of claim 1, wherein the light emitting structure makes contact with the side surface of the pixel defining layer and is spaced apart from the mirror pattern.

8. The organic light emitting display panel of claim 1, wherein the mirror pattern comprises at least one or more of aluminum (Al), chrome (Cr), silver (Ag), iron (Fe), platinum (Pt), mercury (Hg), nickel (Ni), tungsten (W), vanadium (V) and molybdenum (Mo).

* * * * *